United States Patent
Ter Meulen et al.

(10) Patent No.: US 11,204,550 B2
(45) Date of Patent: Dec. 21, 2021

(54) PROCESS AND EQUIPMENT FOR TEXTURING DISCRETE SUBSTRATES

(71) Applicant: MORPHOTONICS HOLDING B.V., Veldhoven (NL)

(72) Inventors: Jan Matthijs Ter Meulen, Eindhoven (NL); Bram Johannes Titulaer, Veldhoven (NL); Adrianus Van Erven, Casteren (NL); Ludovicus Vugts, Moergestel (NL)

(73) Assignee: Morphotonics Holding B.V., Veldhoven (NL)

( * ) Notice: Subject to any disclaimer, the term of this patent is extended or adjusted under 35 U.S.C. 154(b) by 0 days.

(21) Appl. No.: 16/956,973

(22) PCT Filed: Jan. 24, 2019

(86) PCT No.: PCT/EP2019/051747
§ 371 (c)(1),
(2) Date: Jun. 22, 2020

(87) PCT Pub. No.: WO2019/145418
PCT Pub. Date: Aug. 1, 2019

(65) Prior Publication Data
US 2020/0393753 A1 Dec. 17, 2020

(30) Foreign Application Priority Data
Jan. 26, 2018 (EP) .................................. 18153607

(51) Int. Cl.
*G03F 7/00* (2006.01)

(52) U.S. Cl.
CPC .................................. *G03F 7/0002* (2013.01)

(58) Field of Classification Search
None
See application file for complete search history.

(56) References Cited

U.S. PATENT DOCUMENTS 4,128,369 A 12/1978 Kemerer et al.
5,669,303 A 9/1997 Marcas et al.
(Continued)

FOREIGN PATENT DOCUMENTS

CN 103235483 A 8/2013
FR 2 893 610 A 5/2007
(Continued)

OTHER PUBLICATIONS

International Search Report and Written Opinion of the International Searching Authority for International Patent Application No. PCT/EP2019/051747 dated Apr. 15, 2019, 10 pages.
(Continued)

*Primary Examiner* — Alexander M Weddle
(74) *Attorney, Agent, or Firm* — Merchant & Gould P.C.

(57) ABSTRACT

A process and equipment texture substrates. A discrete substrate and a resilient stamp with a patterned outer surface having openings and elevations are coated with a formable imprint lacquer and the stamp is bent around an axis of an imaginary cylinder parallel to the plane of the substrate and perpendicular to the imprint direction to obtain a bent resilient stamp having a particular imprint-curvature. The bent stamp contacts formable imprint lacquer to apply imprint pressure onto a substrate contact area. The imprint pressure is generated by a resilience force of the stamp. The substrate and/or stamp move relative to one another while pressing the outer surface openings/elevations with the imprint pressure into the lacquer to attain an imprint texture while maintaining constant imprint-curvature. The formable imprint lacquer with the imprint texture solidifies on the substrate, and the stamp is separated from the textured substrate.

15 Claims, 6 Drawing Sheets

(56) References Cited

U.S. PATENT DOCUMENTS

| | | | |
|---|---|---|---|
| 5,772,905 A | 6/1998 | Chou | |
| 6,334,960 B1 | 1/2002 | Willson et al. | |
| 7,824,516 B2 | 11/2010 | Amos et al. | |
| 8,027,086 B2 | 9/2011 | Guo et al. | |
| 8,432,548 B2 | 4/2013 | Choi et al. | |
| 2004/0065976 A1 | 4/2004 | Sreenivasan et al. | |
| 2011/0291330 A1 | 12/2011 | Despa et al. | |
| 2013/0214452 A1 | 8/2013 | Choi et al. | |

FOREIGN PATENT DOCUMENTS

| | | | |
|---|---|---|---|
| WO | 2007/060353 A1 | 5/2007 | |
| WO | WO-2016128493 A1 * | 8/2016 | ............. B30B 11/20 |

OTHER PUBLICATIONS

Kooy, N. et al., "A review of roll-to-roll nanoimprint lithography", Nanoscale Research Letters, 9(1): 13 pages (2014).

Chou, S. et al., "Imprint of sub-25 nm vias and trenches in polymers", Appl. Phys. Lett., 67(21): 3114-3116 (Nov. 1995).

Tan, H. et al., "Roller nanoimprint lithography", J. Vac. Sci. Technol. B, 16(6): 3926-3928 (Nov./Dec. 1998).

* cited by examiner

PROCESS AND EQUIPMENT FOR TEXTURING DISCRETE SUBSTRATES

This application is a National Stage Application of PCT/EP2019/051747, filed 24 Jan. 2019, which claims the benefit of European Patent Application Serial No. 18153607.9, filed 26 Jan. 2018, and which applications are incorporated herein by reference. To the extent appropriate, a claim of priority is made to each of the above-disclosed applications.

BACKGROUND OF THE INVENTION

The present invention pertains to a process and to an equipment for texturing discrete substrates such as displays, lighting or solar panels, by imprinting an imprinting lacquer with a stamp onto a discrete substrate, followed by curing of the imprinted lacquer, resulting in an additional functional textured layer on the discrete substrate. The function of this additional layer can amongst others vary from a light management layer to a hydrophobic layer, decorative use or use in biosensors.

The use of functional textured layers on substrates is an important topic. The smart usage of such layers can enhance performance, reduce cost or improve the visual appearance of a product comprising said imprinted substrate. For example diffusing layers are used in displays, enabling the use of thinner LED backlight concepts and illuminating the display from the sides. Other new high tech possibilities are the integration of functional textured layers into solar panels improving their efficiency or integration in organic light-emitting diode (OLED) lighting panels to extract more light.

Functional textured layers can be made by use of imprint lithography. In this case the substrate, or mold, or both are coated with a lacquer (resin or resist). After pressing the mold on the substrate with lacquer in between, the textured lacquer is cured to a solid phase. The curing method can be thermal irradiation or UV light irradiation. Already in 1978 this technology was mentioned in U.S. Pat. No. 4,128,369. Further pioneer work was done by Chou in 1995. He demonstrated that by use of a rigid stamp sub-25 nm textures could be replicated in high throughput mass production (U.S. Pat. No. 5,772,905) or in an article by Stephen Y. Chou, Peter R. Krauss, Preston J. Renstrom (Appl. Phys. Lett. 67 (1995) 3114-3116). Later-on the use of a roller to apply pressure on either a rigid mold or a bended thin metal sheet to replicate textures was demonstrated (article Hua Tan, Andrew Gilbertson, Stephen Y. Chou, J. Vac. Sci. Technol., B 16 (1998) 3926-3928).

Many institutes and companies continued this work, resulting in different techniques.

In the semiconductor industry plate-to-plate imprinting is applied by using a rigid stamp in combination with a transfer process, materials and precise positioning as described in U.S. Pat. No. 6,334,960, US Patent Application 2004/0065976 and U.S. Pat. No. 8,432,548.

The roll-to-roll imprinting technique uses textured rollers in combination with flexible substrates to texture foils or films in a continuous process as described in e.g. the U.S. Pat. No. 8,027,086.

The first mentioned plate-to-plate technique is designed for the precise, wafer-scale imprinting of small textures (resolution in sub-100 nm) on uniform flat wafers with high position accuracy. But as described in the Chinese Patent Application CN 103235483, this technology is difficult to scale to larger areas.

By use of the roll-to-roll technology textured foils can be made continuously at high production speeds. These foils can be used as substrates for flexible applications or can be laminated to rigid substrates. However the latter comes at additional costs of an intermediate adhesive layer to adhere the textured foil to the rigid substrate or product. Therefore a third new technology is being developed: direct roll-to-plate imprinting. Hereby the functional textured layer is directly applied on the discrete substrate without intermediate thick adhesive layers of tens to hundreds of micron thickness. In such processes either a textured roller, as exemplified in the French Patent 2,893,610 or a removable flexible stamp is used, as disclosed in U.S. Pat. No. 7,824,516.

As already mentioned in the introductory paragraph the imprinting is achieved by coating either a lacquer onto a substrate (panel) or onto the mold and imprinting (texturing) the lacquer by contacting the mold and the substrate with lacquer in between. As mold either a flexible stamp, rigid stamp or a textured roller can be used. It is important to control the pressure by which the flexible roller, rigid stamp or textured roller is pressed upon the substrate with imprint lacquer in between. If the pressure is too large, the imprint lacquer will flow to the outside. This outflow of lacquer might reach areas which should not be covered, for example the edges of the substrate. If the pressure is too low, the stamp and substrate might not have proper contact and air can be trapped in between the stamp and the imprint lacquer, or between the imprint lacquer and the substrate. The permanently trapped air will be causing air bubble defects which are solidified by the curing step. These defects will have a negative impact on the product performance. If the applied pressure is not constant, the residual layer underneath of the texture will vary in thickness.

A low pressure imprint process does have several advantages. The benefit of low pressure imprinting is not only to be able to control the outflow of lacquer precisely. It also enables the imprinting of low viscous lacquers. Due to the low viscosity, these lacquers will already rapidly flow aside at a low pressure. The ability to imprint low viscous lacquers will enable the use of precise coating techniques as for instance inkjet printing.

There are different ways to control the pressure:

In the roll-to-plate imprint process as well as the roll-to-roll imprint process a roller is used to press the inverse texture stamp on to the substrate with lacquer in between. The inverse texture can be placed on the roller itself, as discussed in patent application WO2007/060353 A1, or on a flexible foil rolling around the roller, as discussed in patent application US2013/0214452 A1. This roller has a certain weight and position accuracy. To be able to apply low pressure onto the stamp, lacquer and substrate during the imprinting process, a counter force has to be applied on the roller to compensate for its weight and gravity force. This balance is difficult to control continuously in small steps, especially if friction on the gliders is present. This leads to variations of the imprint pressure and consequently to variations of the quality of the imprinted texture.

A second method is to control the height of the roller, instead of controlling the pressure on the roller. In this method the gap between the substrate and the flexible stamp, with lacquer in between, is controlled. If the gap is increased less pressure is applied. This roller height can be controlled in small steps. The drawback of this method is that, if the surface is not flat, for instance due to differences in lacquer volume over the surface, the pressure is not constant over the surface, and air can be trapped.

In a plate-to-plate process it is possible to softly lower the stamp on the substrate with lacquer in between. This can be done by precise equipment, or by use of air pressure to bend a flexible stamp as discussed in patent application U.S. Pat. No. 5,669,303. In both cases the manufacturing process is expensive due to the slow vacuum step and difficult to be scaled up to larger formats.

N. Kooy et al. has given in 2014 a clear review of the different nanoimprint technologies (Nanoscale Res. Lett. 2014; 9(1); 320). In this overview it is discussed that the roll-to-plate technology has the advantage of being capable of imprinting at the lowest pressure. A low imprint pressure of 1 bar (or 10 N/cm$^2$) is referred to. At this moment the technology has been further improved. The UV imprint lacquer supplier Micro-resist has developed <1 N/cm$^2$ low pressure imprint lacquer. At this moment roll-to-plate imprint equipment can handle a pressure of around 0.5 to 1 N/cm$^2$ (or 50 to 100 mbar).

US 2011/0291330 A1 disclose a lamination or replication method for making article having a structured solid layer. In this method a curable liquid is dispensed onto a first member and a second member is laid down onto the curable liquid on the first member by exhibiting varying curvatures.

As explained before, the known processes for imprinting discrete substrates are not able to apply a low and, nevertheless, constant imprint pressure below 0.5 N/cm$^2$, or lead to entrapped air, or need expensive equipment or air pressure and in all cases are slow and difficult to be scaled up to larger formats.

Therefore, the problem underlying the present invention is to enable imprinting of discrete substrates at low and constant imprint pressure in the range of <0.5 N/cm$^2$ at lower costs and with the capability to be scaled up easier.

Said problem is solved by a process and by an equipment described later on for texturing a discrete substrate 102 with an imprint texture 103B, wherein the process comprises the steps a) providing a resilient stamp 104 comprising a patterned outer surface 105B comprising openings and elevations,
b) providing a discrete substrate 102,
c) coating the resilient stamp 104 and/or the discrete substrate 102 with a formable imprint lacquer 103A,
d) bending the resilient stamp 104 around one imaginary bending axis 108C formed by an imaginary cylinder 108A, which axis is parallel to the plane of the discrete substrate 102 and perpendicular to the imprint direction, to obtain a bent resilient stamp 104 having a first leg 104A and a second leg 104B, whereby the bending is performed such that the second leg 104B is bent in at least a fraction of the direction of the first leg 104A,
e) contacting the bent resilient stamp 104 with formable imprint lacquer 103A between bent resilient stamp 104 and discrete substrate 102 so that the bent resilient stamp 104 applies an imprint pressure onto the discrete substrate 102 onto a contact area 112, wherein the imprint pressure is essentially generated by a resilient force of the bent resilient stamp 104, wherein the bent resilient stamp 104 exhibits an imprint-curvature, wherein the imprint-curvature is defined by a radius 108B of an imaginary circle 108A which is drawn around the bent resilient stamp 104 bent around the imaginary bending axis 108C,
f) moving the discrete substrate 102 and/or the resilient stamp 104 relative to one another and during said moving pressing the openings and elevations of the patterned outer surface 105B with the imprint pressure into the formable imprint lacquer 103A to provide the formable imprint lacquer 103A with the imprint texture 103B and during said moving keeping the imprint-curvature of the bent resilient stamp 104 constant,
g) solidifying the formable imprint lacquer 103A provided with the imprint texture 103B on the substrate 102, and
h) separating the resilient stamp 104 from the textured discrete substrate 102.

Said process enables imprinting of discrete substrates at a low and constant imprint pressure in the range of <0.5 N/cm$^2$, at lower costs and with the capability to be scaled up easier.

Surprisingly said imprint pressure is 10 times lower than the current standard imprint pressure and amounts to a constant value $p_{imprint}$ which preferably ranges from 0.01 N/cm$^2$ to 50 N/cm$^2$, especially preferred from 0.01 N/cm$^2$ to 5 N/cm$^2$. Though said imprint pressure is so low, $p_{imprint}$ maximally fluctuates during imprinting of the discrete substrate 102 in a range of ±50% of $p_{imprint}$, and in preferred embodiments of the inventive process in an even smaller range of ±20% of $p_{imprint}$.

And it is surprising that the inventive process gets along with simple components and process steps, so that the inventive process can be performed at lower costs than known imprinting processes, which need a low imprint pressure. For example, the inventive process does not need a roller for imprinting the discrete substrate 102. Therefore, with the inventive process it is no more necessary to compensate the roller weight in order to apply a low imprint pressure on the discrete substrate 102. The surprising simplicity of the inventive process allows easy upscaling to larger formats of the discrete substrate 102 to be imprinted.

In step a) of the inventive process a resilient stamp 104 is provided comprising a patterned outer surface 105B comprising openings and elevations. Within the scope of the present invention the term "resilient stamp" means a stamp, which is able to return to its original plane shape after being bent. Said ability can be achieved by proper selection of the Young's Modulus and/or the thickness of the stamp.

Preferably, the resilient stamp 104 provided in step a) of the inventive process exhibits a Young's Modulus in the range from 0.1 GPa to 210 GPa, more preferred in the range from 0.2 GPa to 5 GPa. If the resilient stamp provided in step a) of the inventive process exhibits a high Young's Modulus, as it is the case for example for thin resilient stamps made of thin nickel sheets, its Young's Modulus preferably ranges from 180 GPa to 210 GPa, if the resilient stamp provided in step a) of the inventive process exhibits a medium Young's Modulus, as it is the case for example for thin resilient stamps made of thin glass, its Young's Modulus preferably ranges from 50 GPa to 100 GPa. If the resilient stamp provided in step a) of the inventive process exhibits a low Young's Modulus, as it is the case for example for thin resilient stamps made of polymer foils, its Young's Modulus preferably ranges from 0.2 GPa to 5 GPa.

Preferably, the resilient stamp 104 provided in step a) of the inventive process has a thickness in the range from 10 µm to 2000 µm, more preferred in the range from 50 µm to 500 µm.

The resilient stamp 104 provided in step a) of the inventive process may consist of one or more layers bonded to one another. If the resilient stamp 104 consists of two or more layers, it is preferred that the resilient stamp 104 comprises a resilient stamp base 105A which is bonded to a patterned outer surface 105B comprising openings and elevations.

Preferably, a material for the resilient stamp base 105A and/or for the patterned outer surface 105B comprising openings and elevations is selected from a group comprising metal sheets, plastic sheets, rubber sheets or glass sheets.

In step b) of the inventive process a discrete substrate 102, also called panel, is provided. Said discrete substrate or panel can be a sub-assembly, as for instance a glass substrate, a plastic substrate or a metal substrate or can be a finished device such as a display, a lighting or a solar panel. A preferred material for the discrete substrate 102 comprises glass, metal sheets, polycarbonate, polyester, like polyethylenenaphthalate (PEN) or polyethyleneterephthalate (PET), or polymethylmethacrylate (PMMA). Furthermore, the material for the discrete substrate 102 may be made of another polymer. The discrete substrate 102 may carry one additional layer or two or even more than two additional layers on top of its surface like for instance an adhesion promotor layer and/or a transparent conductor layer, e.g. an indium tin oxide layer, an aluminum doped zinc-oxide layer or a flour-doped tin oxide layer.

In step c) of the inventive process the resilient stamp 104 and/or the discrete substrate 102 is coated with a formable imprint lacquer 103A, wherein a preferred method for the coating in step c) is dispensing, ink-jet-printing, slot-die coating, gravure printing, screen-printing, jetting, flexo-printing, or roller coating.

In the course of the present invention the term "formable imprint lacquer 103A" means a substance that can be coated onto a discrete substrate 102 and/or onto a resilient stamp 104 and textured (imprinted) by methods known to those skilled in the art, for example by one of the methods described in the above paragraph. The formable imprint lacquer 103A usually comprises monomers, oligomers, with possibly added photo-initiators and crosslinking acrylate groups. Other possible materials are—but not limited to—curable sol-gels and epoxies. The formable imprint lacquer 103A has a viscosity which may be similar as low as the viscosity of water, so that the formable imprint lacquer 103A may have a viscosity ranging from 5 cP to 5000 cP, preferably ranging from 5 cP to 500 cP at room temperature (cP means centipoise).

The formable imprint lacquer 103A is capable of being cured to retain the imprinted pattern. These curing processes are also known and encompass thermal curing, curing by UV light, chemically induced curing and other methods known per se. Such lacquers are also referred to as coatings, resins, resists and the like.

In step d) of the inventive process the resilient stamp 104 is bent around one imaginary bending axis 108C formed by an imaginary cylinder 108A, which axis is parallel to the plane of the discrete substrate 102 and perpendicular to the imprint direction, to obtain a bent resilient stamp 104 having a first leg 104A and a second leg 104B, whereby the bending is performed such that the second leg 104B is bent in at least a fraction of the direction of the first leg 104A.

Within the scope of the invention, the term "leg" has to be understood as a part of the resilient stamp 104, which occurs after bending the resilient stamp. After bending the resilient stamp 104, the bent resilient stamp 104 comprises two legs: the first leg 104A and the second leg 104B.

By bending the resilient stamp 104 the radius 108B can have any dimension, which is suitable for texturing a discrete substrate 102 with an imprint texture 103B. In a preferred embodiment the radius 108B comprises a value preferably between 0.5 cm and 50 cm, more preferably between 1 cm and 20 cm, and most preferably between 2 cm and 10 cm.

In step e) of the inventive process the resilient stamp 104 is contacted with the formable imprint lacquer 103A between bent resilient stamp 104 and discrete substrate 102 so that the bent resilient stamp 104 applies an imprint pressure onto the discrete substrate 102 onto a contact area 112, wherein the imprint pressure is essentially generated by a resilience force of the bent resilient stamp 104, wherein the bent resilient stamp 104 exhibits an imprint-curvature, wherein the imprint-curvature is defined by a radius 108B of an imaginary cylinder 108A which is drawn around the bent resilient stamp 104 bent around the imaginary bending axis 108C.

In a preferred embodiment, an overlapping boundary 108D of the imprint-curvature of the bent resilient stamp 104 with the imaginary cylinder 108A draws at least 20%, preferably at least 25%, more preferably at least 26%, even more preferably at least 30% and most preferably at least 50% of the circumference of the imaginary cylinder 108A.

For a selected resilient stamp 104 its imprint-curvature ic is inversely proportional to the radius r 108B of the imaginary cylinder 108A which is drawn around the bent resilient stamp 104 bent around the imaginary bending axis 108C, which is parallel to the plane of the discrete substrate 102 and perpendicular to the imprint direction. Therefore, ic increases with decreasing r and vice versa, as summarized in relation [1].

$$ic \sim 1/r \quad [1]$$

Furthermore, for a selected resilient stamp 104 its imprint pressure $p_{imprint}$ is proportional to its imprint-curvature ic. Therefore, $p_{imprint}$ increases with increasing ic, and decreases with increasing r, as summarized in relation [2].

$$p_{imprint} \sim ic \sim 1/r \quad [2]$$

Finally, an applied force N which the bent resilient stamp 104 exerts on substrate 102 with the formable imprint lacquer 103A between bent resilient stamp 104 and discrete substrate 102 is proportional to ic and to $p_{imprint}$, and inversely proportional to r, as summarized in relation [3].

$$N \sim p_{imprint} \sim ic \sim 1/r \quad [3]$$

As already mentioned, the imprint pressure $p_{imprint}$ is low. Therefore, also the applied force N is low.

The inventive process allows to provide a low desired force N simply by bending the resilient stamp 104 to a certain radius r, i.e., to a certain bending radius r 108B. And the inventive process allows to control said desired force N—and thereby to control the quality of the imprint texture 103B—very precisely simply by variating the bending radius r 108B of the bent resilient stamp 104 in nearly infinitesimal small intervals.

In the inventive process the same imprint pressure $p_{imprint}$ and the same force N is applied at the stamp-substrate contact area 112 of the resilient stamp 104 with the formable imprint lacquer 103A in between along the width of the discrete substrate 102 to be imprinted. Therefore, if the discrete substrate 102 and/or the resilient stamp 104 are moved relatively to one another according to step f) of the inventive process allows, the inventing process enables to control the quality of the imprint texture 103B—and thereby to control the quality of the imprint texture 103B—over the area of the discrete substrate 102.

In step f) of the inventive process the discrete substrate 102 and/or the resilient stamp 104 are moved relatively to one another and during said moving the openings and elevations of the patterned outer surface 105B are pressed with the imprint pressure into the formable imprint lacquer 103A to provide the formable imprint lacquer 103A with the imprint texture 103B, and during said moving the imprint-curvature of the bent resilient stamp 104 is kept constant.

Within the scope of the present invention the wording in step e) of the inventive process "the imprint pressure is essentially generated by a resilience force of the bent resilient stamp 104" means that the imprint pressure is mainly generated by the resilience force of the resilient stamp 104, i.e., by the capability of the resilient stamp 104 to return to its original plane shape after having been bent. Additionally, the weight of the resilient stamp 104 generates an imprint pressure onto the imprint lacquer. However, said imprint pressure is usually much lower than the pressure generated by the resilience force of the resilient stamp 104.

In step f) of the inventive process the discrete substrate 102 and/or the resilient stamp 104 is moved relative to one another and during said moving the openings and elevations of the patterned outer surface 105B are pressed with the imprint pressure into the formable imprint lacquer 103A to provide the formable imprint lacquer 103A with the imprint texture 103B, and during said moving the imprint-curvature of the bent resilient stamp 104 is kept constant.

Within the scope of the present invention the wording in step f) of the inventive process "during said moving the imprint-curvature of the bent resilient stamp 104 is kept constant" means that the radius 108B of the imaginary cylinder 108A exhibits a value r, and r variates within a range which is acceptable for the desired quality of the imprint texture 103B. Because of the fact that the imprint pressure which the bent resilient stamp 104 applies on the discrete substrate 102 with formable lacquer 103A between bent resilient stamp 104 and discrete substrate 102 is low in the inventive process, said low imprint pressure may vary in a relatively large range without impairing the quality of the imprint texture 103B. For example, if the radius 108B of the imaginary cylinder 108A exhibits a value r, said r may variate within a range of ±50% of r before starting the imprint process.

For higher imprint pressure this variation can be too large. In this case the variation of imprint curvature with radius r should be in the range of ±20%, preferably in the range of ±10% and in more preferred embodiments of the inventive process in a range of ±5%. For lower imprint pressure this variation is less.

Also, the phrase "during said moving the imprint-curvature of the bent resilient stamp 104 is kept constant" may imply that the drawn amount of the imaginary cylinder 108A by the overlapping boundary 108D variates within a range, which is acceptable for the desired quality of the imprint texture 103B.

In step g) of the inventive process the formable imprint lacquer 103A provided with the imprint texture 103B on the substrate 102 is solidified with the aid of a solidification procedure, e.g. with the aid of UV-irradiation.

In step h) of the inventive process the resilient stamp 104 is separated from the textured discrete substrate 102 with the aid of a separation procedure, e.g., by reversing the direction of moving which was practiced in step f) of the inventive process.

In a preferred embodiments of the inventive process the resilient stamp 104 is mounted in a front clamp 106A which has been positioned at an onset of the resilient stamp 104 and in a back clamp 106B which has been positioned at an end of the resilient stamp 104, and during the moving in step f) a glider 110 supports a uniform movement of the back clamp 106B and/or the front clamp 106A. The movement of the back clamp 106B and/or the front clamp 104A can be steered with for example a belt, a motor, or a screw thread.

During the imprinting process and the movement of the back clamp 106B with the resilient stamp 104, the support platform 101, substrate 102 and front clamp 106A can be at a fixed position. In another possible setup of the inventive process the support platform 101 with substrate 102 and the front clamp 106A move at the same speed and in opposite direction as the movement of the back clamp 106B. To ensure the same moving speed of the support platform 101 with substrate 102 and front clamp 106A and of the back clamp 106B either a belt can be used or a master-slave steering of two motors.

In a further preferred embodiment of the inventive process the imprint-curvature of the resilient stamp 104 is steered by a height of the movement of the clamp 106B, possibly in combination with a height of a glider 110, wherein the term "height" may be measured by the distance between clamp 106B and the discrete substrate 102 and by the distance between the glider 110 and the discrete substrate 102.

In a further preferred embodiment of the inventive process a flexible stamp height blocker 109, preferably with adjustable height position, is located above the resilient stamp 104 in a non-bent region of the resilient stamp 104 between the back clamp 106B and a bent-region of the resilient stamp 104 and further controls the imprint pressure by controlling the imprint-curvature of the bent resilient stamp 104.

In a further preferred embodiment of the inventive process an imprint-curvature control wedge 111 which is placed at the inside of the bent resilient stamp 104 presses the resilient stamp 104 into a desired imprint-curvature.

SUMMARY OF THE INVENTION

The object underlying the present invention is furthermore solved by an equipment for texturing a discrete substrate 102 comprising i. a discrete substrate 102 defining a substrate plane,
ii. a resilient stamp 104 comprising a patterned outer surface 105B comprising openings and elevations, wherein
  a. the resilient stamp 104 is mounted in a front clamp 106A which is positioned at an onset of the resilient stamp 104 and in a back clamp 106B which is positioned at an end of the resilient stamp 104,
  b. the resilient stamp 104 comprises a second leg 104B which is steadily followed by a bent area which is steadily followed by a first leg 104A which is in contact with the substrate plane with formable imprint lacquer 103A between resilient stamp 104 and discrete substrate 102,
  c. the resilient stamp 104 is bent in the bent area around one imaginary bending axis 108C formed by an imaginary cylinder 108A, which cylinder is parallel to the plane of the discrete substrate 102 and perpendicular to the imprint direction to obtain a bent resilient stamp 104, so that the bent resilient stamp 104 applies an imprint pressure onto the discrete substrate 102 onto a contact area, wherein the imprint pressure is essentially generated by a resilience force of the bent resilient stamp 104, wherein the bent resilient stamp 104 exhibits one imprint-curvature, wherein the imprint-curvature is defined by a radius 108B of an imaginary cylinder 108A which is drawn around the bent resilient stamp 104 bent around the imaginary bending axis 108C,
iii. a first moving means coupled with the back clamp 106B and capable of moving the bent resilient stamp 104 in contact with the discrete substrate 102 with formable imprint lacquer 103A between resilient stamp 104 and discrete substrate 102, wherein the discrete substrate 102 is in a fixed position, and/or a second moving means coupled with the support platform 101 and/or the front clamp 106A and capable of moving the support platform 101 with the bent resilient stamp 104 thereon and/or the front clamp 106A with resilient stamp 104 clamped therein at the same speed but in opposite direction as the movement of the front clamp 106B, iv. means to control the imprint-curvature of the bent resilient stamp 104, whereby the imprint-curvature is adjusted and/or kept constant, and v. a device for solidification of the formable imprint lacquer 104 provided with an imprint texture 103B.

Within the scope of the present invention the meanings of the wordings "discrete substrate 102", "resilient stamp 104", "patterned outer surface 105B", "front clamp 106A", "back clamp 106B", "wherein the imprint pressure is essentially generated by a resilience force of the bent resilient stamp 104", "keeping the imprint-curvature of the bent resilient stamp 104 constant" are analogously the same as already explained for the inventive process.

In a preferred embodiment of the inventive equipment said equipment furthermore comprises at least one glider 110 to support uniform movement of the resilient stamp 104.

In a further preferred embodiment of the inventive equipment said equipment comprises a mean which is able to realize a desired height of the movement of the clamp 106B, possibly in combination with a means which is able to realize a desired height of a glider 110 in order to steer the imprint-curvature of the resilient stamp 104, wherein the term "height" may be measured by the distance between clamp 106B and the discrete substrate 102 and by the distance between the glider 110 and the discrete substrate 102.

In a further preferred embodiment of the inventive equipment said equipment furthermore comprises a stamp height blocker 109 to control an imprint-curvature of the bent resilient stamp 104.

In a further preferred embodiment of the inventive equipment said equipment furthermore comprises an imprint-curvature control wedge 111 to control an imprint-curvature of the bent resilient stamp 104.

In a preferred embodiment, the inventive equipment comprises an overlapping boundary 108D of the imprint-curvature of the bent resilient stamp 104 with the imaginary cylinder 108A, which draws at least 20%, preferably at least 25%, more preferably at least 26%, even more preferably at least 30% and most preferably at least 50% of the circumference of the imaginary cylinder 108A.

BRIEF DESCRIPTION OF THE DRAWINGS

The invention is being explained now in more detail with reference to the following Figures:

FIG. 2 depicts applied and measured forces on a curved, i.e., bent resilient stamp 104 during imprinting according to the present invention as a function of the radius of an imaginary cylinder 108A which is drawn around the resilient stamp 104 at the first stamp-substrate contact area 112 with the formable imprint lacquer 103A in between.

DETAILED DESCRIPTION OF THE PREFERRED EMBODIMENT

Figure 1:
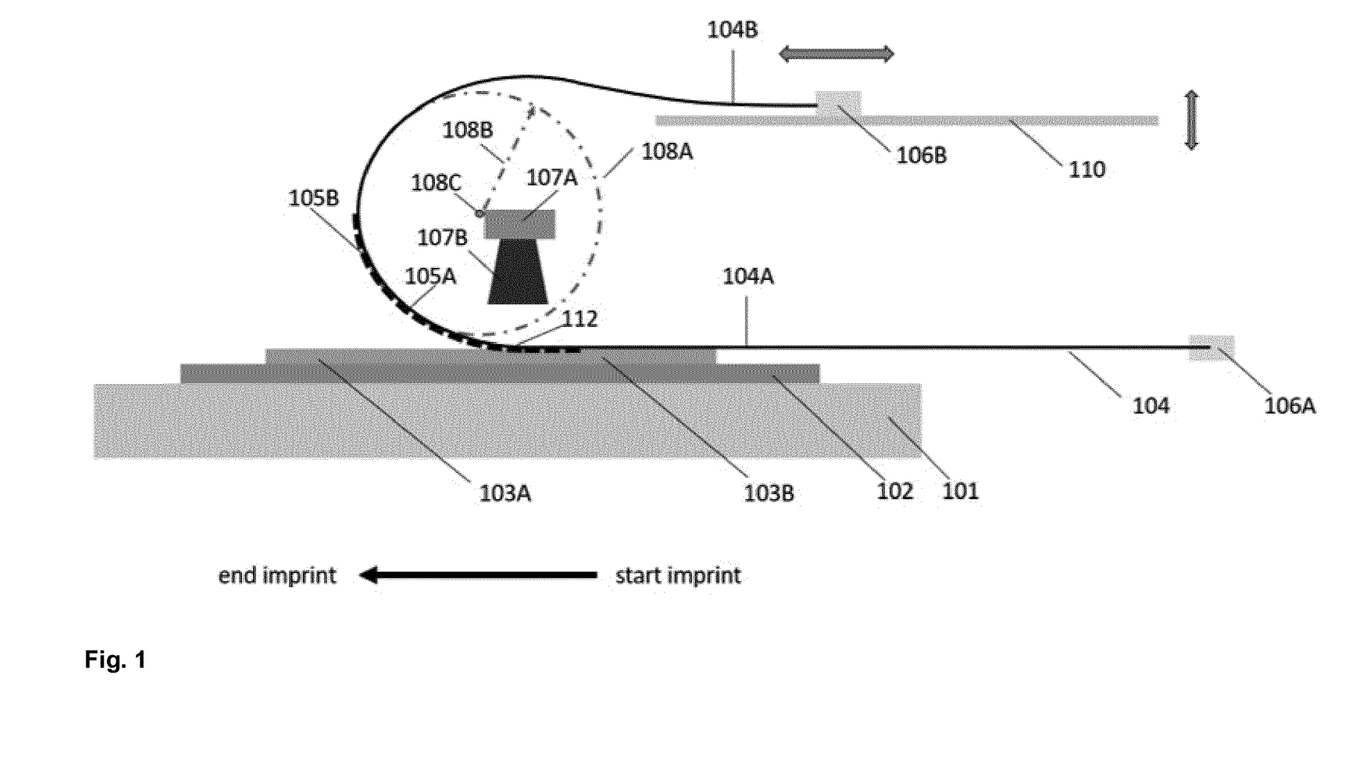
FIG. 1 schematically depicts an imprinting process according to the present invention wherein the curvature of the bent resilient stamp 104 is controlled.

Referring now to FIG. 1, a schematic imprint equipment and process according to the present invention is illustrated whereby the imprint-curvature of the resilient stamp 104 is used to apply a low and constant imprint pressure, wherein the imprint-curvature is defined by the radius 108B of the imaginary cylinder 108A which is drawn around the bent resilient stamp 104 bent around the imaginary bending axis 108C formed by an imaginary cylinder 108A, which axis is parallel to the plane of the discrete substrate 102 and perpendicular to the imprint direction. Thereby, the bent resilient stamp 104 comprises a first leg 104A and a second leg 104B. By adjusting the imprint-curvature of the resilient stamp 104 the imprint pressure can be controlled. Because of the fact that the imprint pressure which the bent resilient stamp 104 applied on the discrete substrate 102 with formable lacquer 103A between bent resilient stamp 104 and discrete substrate 102 is low in the inventive process, said low imprint pressure may vary in a relatively large range without impairing the quality of the imprint texture 103B. For example, if the radius 108B of the imaginary cylinder 108A exhibits a value r, said r may variate within a range of ±50%, and in more preferred embodiments in a range of ±20%.

In the imprint equipment shown in FIG. 1 the functional imprint layer 103B will be applied on top of the substrate 102. The substrate 102 can be any material; preferably the substrate 102 comprises or is made of glass, metal sheets, polycarbonate, polyethylenenaphthalate (PEN), polyethyleneterephthalate (PET), or polymethylmethacrylate (PMMA). The substrate 102 may carry one or more additional layer(s) coated on top of the surface like for instance an adhesion promotion layer and/or a transparent conductor layer (e.g. an indium tin oxide layer, an aluminum doped zinc-oxide layer or a flour doped tin oxide layer). In FIG. 1 the substrate 102 is coated with a formable imprint lacquer 103A according to step c) of the inventive process and in step f) of the inventive process this formable imprint lacquer 103A is imprinted with the resilient stamp 104, resulting in a replicated imprint texture 103B which is added on top of substrate 102. The substrate 102 is placed on platform 101 for guidance and support. This platform 101 can be one or multiple rollers, a fixed table, moving table or any other platform providing sufficient support. In FIG. 1 the mold is a resilient stamp 104. The resilient stamp 104 has a supporting flexible stamp base 105A and a patterned outer surface 105B, also referred to as "the imprint texture" or "the imprint pattern". This imprint texture comprises a functional area which is formed by openings and elevations, which for the ones skilled in the art is known as relief pattern. This relief patterned outer surface 105B is the negative (or inverse) texture of the imprint texture 103B on the substrate 102. The resilient stamp base 105A and the patterned outer surface 105B can be made of one and the same material, as for instance—but not limited to—thin metal sheets or plastic sheets made by a milling or hot embossing process. The flexible stamp 104 can also be made using two or more materials which have a resilient sheet as base 105A, as for instance but not limited to polyethyleneterephthalate (PET) foil, polycarbonate (PC) foil, polyethylenenaphthalate (PEN) foil or foils made of another polymer, or thin metal sheets or thin glass sheets, and an adhered textured organic layer 105B, as for instance but not limited to an acrylate material, a sol-gel material, an epoxy or second textured plastic foil. Even more layers can be added to enhance robustness or functionality of the flexible stamp, as for instance an anti-stick layer. Preferably, the flexible stamp 104 exhibits a Young's Modulus between 0.1 Giga Pascal (GPa) and 210 Giga Pascal (GPa), especially preferred between 0.2 Giga Pascal (GPa) and 5 Giga Pascal (GPa). The Young's Modulus is measured according to ASTM E111.

As shown in FIG. 1 the flexible stamp is bent. Given the outer ends are fixated, the stamp is free to recoil itself to its preferred plane shape. Therefore, this flexible stamp is called a resilient stamp 104.

To transfer the texture of the flexible resilient stamp 104 with its outer surface onto the formable imprint lacquer 103A, the imprint texture 105B, having the inverse texture of the imprint texture 103B, is pressed on the discrete substrate 102 with the imprint lacquer 103A in between. Note that the formable lacquer 103A can be deposited on the discrete substrate 102 as shown in FIG. 1, or the formable imprint lacquer 103A can be deposited on the resilient stamp 104. Or the formable imprint lacquer 103A can be deposited both on the resilient stamp 104 and on the discrete substrate 102. The method of deposition can, amongst others, be dispensing, ink-jet printing, slot-dye coating, gravure printing, or screen-printing. After imprinting the formable imprint lacquer 103A with use of the resilient stamp 104, the formable imprint lacquer 103A is solidified either thermally or by use of UV light. In FIG. 1 the formable lacquer is solidified by use of the UV light 107B from the UV light source 107A. The UV light source 107A can be placed within the imprint-curvature of the resilient stamp 104 or above the transparent resilient stamp 104. Or in case the discrete substrate 102 is transparent, the UV light source 107A can be placed underneath of the transparent discrete substrate 102 either integrated in the platform 101 or underneath of a transparent platform 101. For large imprinted surfaces the UV light source 107A can be mounted on a moving stage, to make sure the large surface is illuminated uniformly. After solidifying of the imprint texture 103B, the resilient stamp 104 is separated from the solidified imprint texture 103B on discrete substrate 102 such that the discrete substrate 102 with solidified imprint texture 103B thereon is spaced apart from the template in the form of the resilient stamp 104.

The resilient stamp 104 is mounted in the front clamp 106A and in the back clamp 106B. The front clamp 106A is positioned at the onset of the resilient stamp 104. The back clamp 106B is positioned at the end of the resilient stamp 104. The clamp 106A and/or the clamp 106B can be a plastic or metal bar, possibly with a mounting opening. But the clamp 106A and/or the clamp 106B can also be a tape or any other means to hold the resilient stamp 104 on its place. Once the resilient stamp 104 is mounted in the clamps 106A and 106B, the resilient stamp 104 will be bent in one circular or elliptical curve. The curvature of the resilient stamp 104 at the first stamp-substrate contact area 112 with the formable imprint lacquer 103A between bent resilient stamp 104 and discrete substrate 102 is defined by the radius 108B of the imaginary cylinder 108A drawn around the bent resilient stamp 104 bent around the imaginary bending axis 108C. The imprint-curvature is kept constant during moving the resilient stamp 104, whereby the openings and elevations of the patterned outer surface 105B are pressed with the imprint pressure into the formable lacquer 103A to provide the formable imprint lacquer 103A with the imprint texture 103B.

Figure 2:
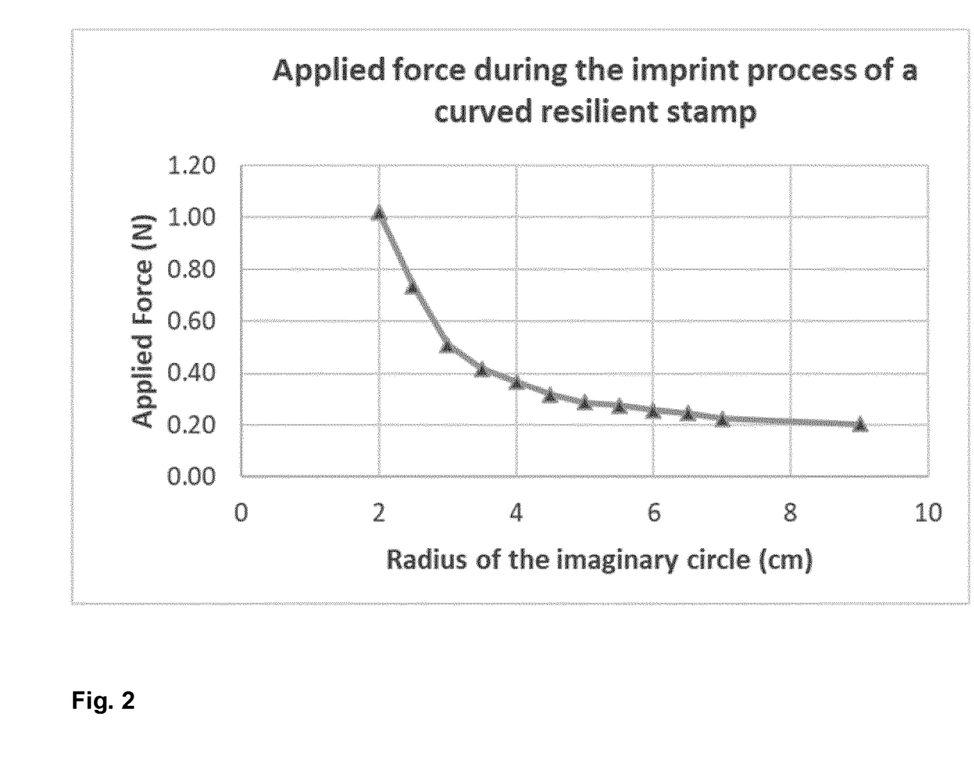

FIG. 2 shows the applied forces during the imprinting process for a 250 micron thick curved, i.e., bent resilient stamp 104 of 10 cm width and a contact surface area of 40 $cm^2$. The forces are determined on a weighing device. Said forces are shown as a function of the radius of the imaginary roller, i.e., of the imaginary cylinder 108A depicted in FIG. 1.

As shown in FIG. 2, for lower imprint pressures, i.e., for lower applied forces the variation of the imprint-curvature, i.e., the variation of the radius 108B of the imaginary cylinder 108A, has less impact on said imprint pressures as for higher imprint pressures, i.e., for higher applied forces with a smaller radius 108B of the imaginary cylinder 108A. Therefore, for lower applied forces the radius variation of the imprint curvature, the radius variation should be within a range of ±50% of r before starting the imprint process. For higher applied forces with a smaller radius 108B of the imaginary cylinder 108A a variation of ±50% will result in large pressure variation. Therefore, more preferred, the diameter variation is within a range of ±20%, preferably in a range of ±10%. Especially preferred the radius variation is within a range which is lower than ±5%.

To reduce the variation of the imprint-curvature, the back clamp 106B has to be able to make a uniform movement. In FIG. 1 the back clamp 106B will move to the left side at the start of the replication process, i.e., of the imprinting process.

Hereby the resilient stamp 104 will be pressed on the formable imprint lacquer 103A. After solidifying of the formable imprint texture 103B with resilient stamp 104 on top, the back clamp 106B is moved to the right side. Hereby the resilient stamp 104 is delaminated from the imprint texture 103B. The movement of the back clamp 106B can, amongst others, be controlled with a belt, a motor or screw thread. To ensure a uniform movement of the back clamp 106B, the movement of said clamp can be supported by for instance a glider. In FIG. 1 the glider 110 supports the movement of the back clamp 106B, to ensure a uniform imprint process, whereby the imprint pressure remains the same during the imprint process. The length of the glider 110 should support the full replication cycle. To do this the glider 110 has typically a length which is slightly larger than the imprint texture 103B or the length of the discrete substrate 102. The height of the movement of the back clamp 106B and thereby the glider 110 does have impact on the curvature of the resilient stamp 104 and thereby on the imprint pressure. Therefore, the height of movement of the stamp back clamp 106B can be a steering parameter to control the imprint pressure.

During the imprinting process and the movement of the back clamp 106B with the resilient stamp 104, the support platform 101, substrate 102 and front clamp 106A can be at a fixed position. In another possible setup of the inventive process the support platform 101 with substrate 102 and the front clamp 106A move at the same speed and in opposite direction as the movement of the back clamp 106B. To ensure the same moving speed of the support platform 101 with substrate 102 and front clamp 106A and of the back clamp 106B either a belt can be used or a master-slave steering of two motors.

Figure 3:
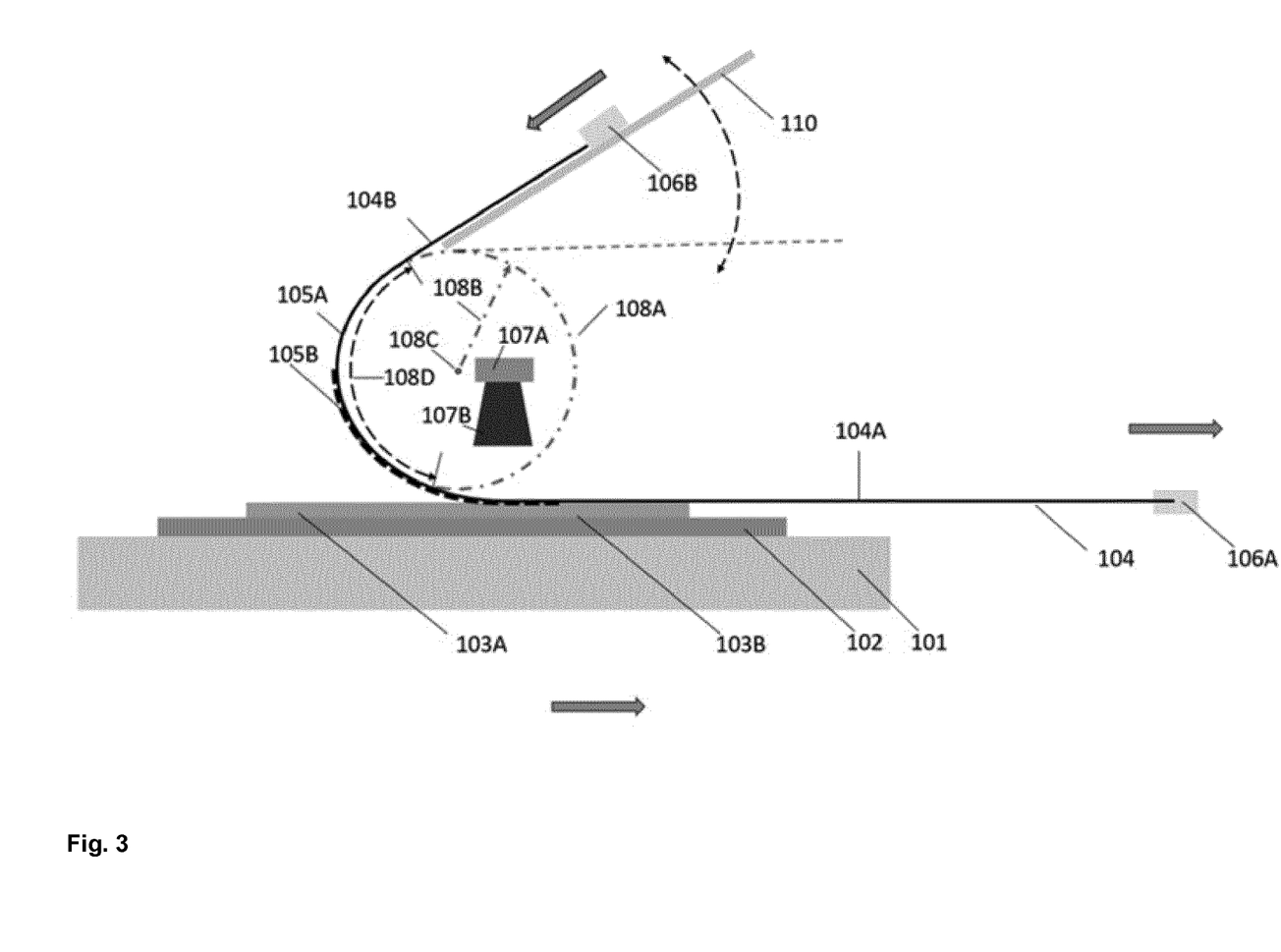
FIG. 3 schematically depicts an imprinting process according to the present invention with the leg 104B of a resilient stamp 104 set at a specific angle.

The positioning of the glider 110 and thereby the movement of the resilient stamp 104 does not necessarily have to be horizontal as shown in FIG. 3. If the movement of the glider 110 is horizontal as shown in FIG. 1, no additional vertical pressure is applied on the stamp apart from the force applied by the bending of the resilient stamp 104. If the movement of the glider 110 is made under an angle compared to the plane of the discrete substrate 102, the imprint-curvature of the resilient stamp 104 and thereby the imprint pressure will not remain constant. In this case the imprint-curvature can be kept constant by moving the support platform 101 with discrete substrate 102 and the front clamp 106A at the same speed as the back clamp 106B in the glider 110, placed under an angle. In FIG. 3 the motion of both the clamps 106A and 106B as well as the moving of the discrete substrate table 101 are shown during imprinting. The movement during delamination will be the reverse.

The specific position of the glider, placed under an angle, can be best described by the resulting overlapping boundary 108D of the imaginary cylinder 108A. By changing the position of the glider, the overlapping boundary 108D of the imprint-curvature of the bent resilient stamp with the imaginary cylinder 108A will change. The overlapping boundary 108D of the imprint-curvature of the bent resilient stamp 104 with the imaginary cylinder 108A, is preferably at least 20%, more preferably at least 30% and most preferably at least 50%.

Figure 4:
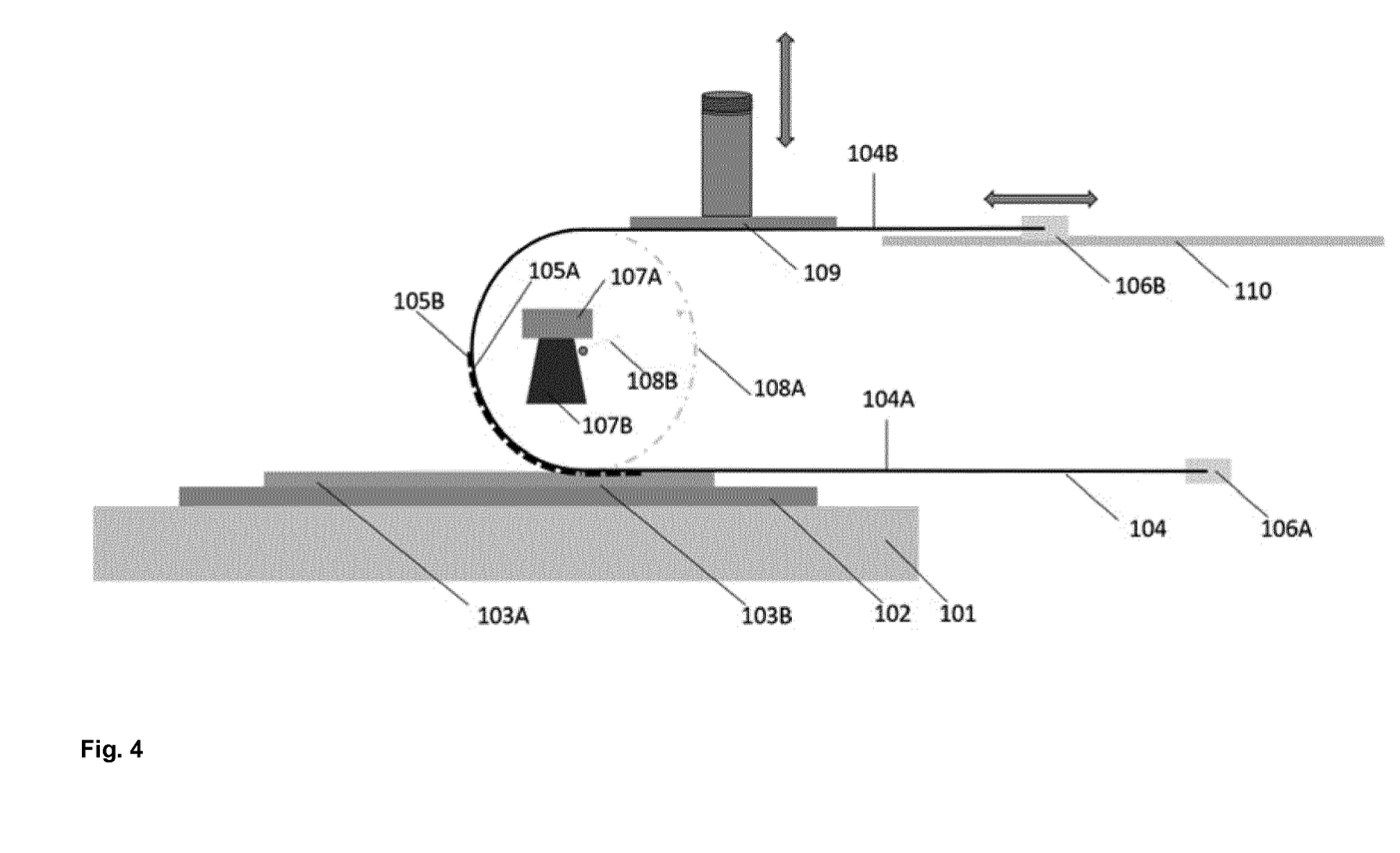
FIG. 4 schematically depicts the use of a stamp height blocker 109 according to the present invention to steer and thereby control the imprint-curvature of the resilient stamp 104.

To further control the imprint pressure a flexible stamp height blocker 109 can be added to control the imprint-curvature of the resilient stamp 104, as shown in FIG. 4. The stamp height blocker is located above the rounding of the resilient stamp 104, to control the imprint-curvature of the resilient stamp 104 during the imprint process. The height of this stamp height blocker 109 can be actively controlled. It can be raised or lowered, as illustrated by the arrow with a raising and a lowering direction. Thereby this flexible stamp height blocker 109 will control the imprint pressure applied during the imprinting process. Moreover the height blocker 109 will limit variations in the imprint-curvature and thereby keep the imprint-curvature more constant. The height of the glider 110 can be coupled with the height of the height-controllable stamp height blocker 109.

Within the inventive process and with the inventive equipment there are further and different manners to control the imprint-curvature of the resilient stamp 104.

Figure 5:
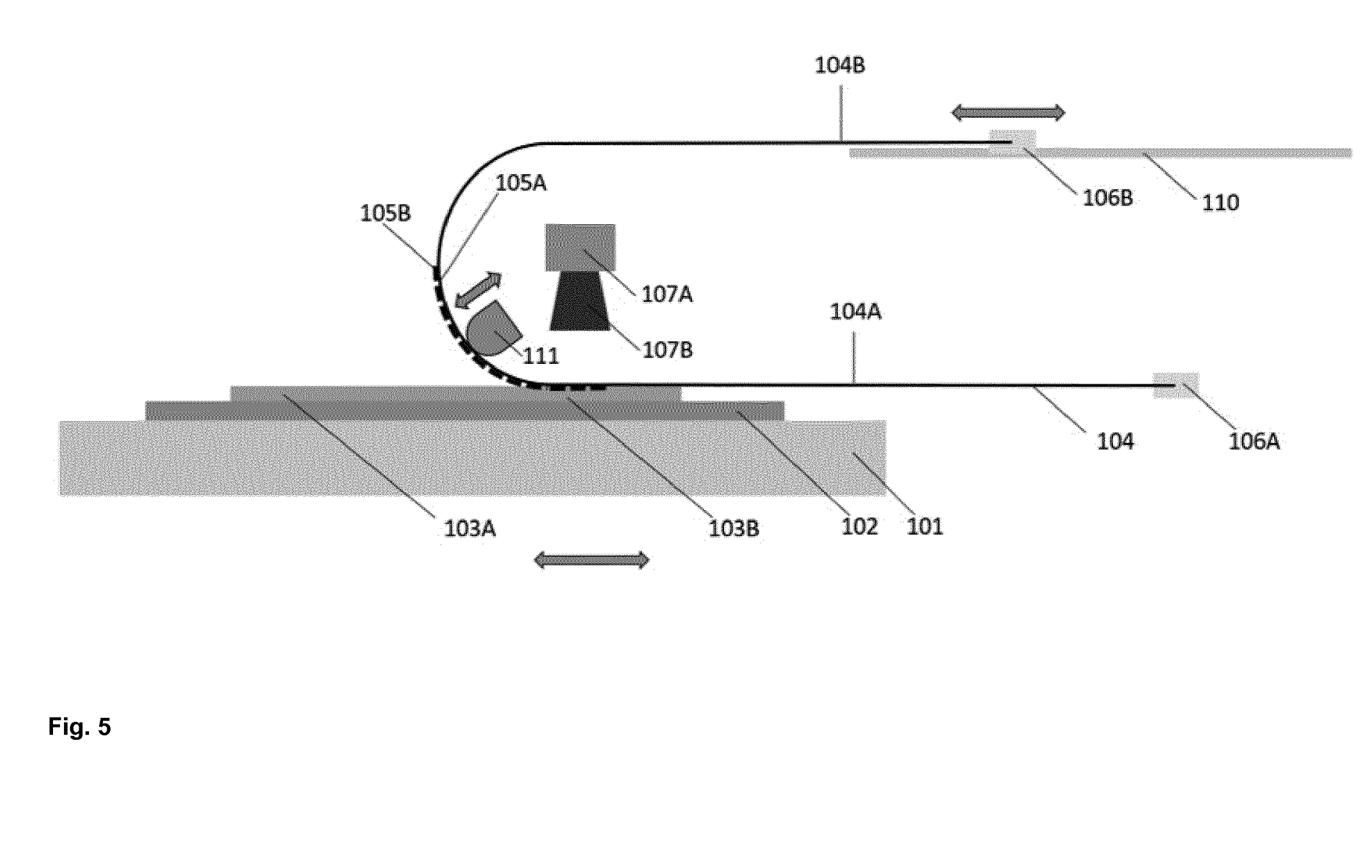
FIG. 5 schematically depicts the use of an imprint-curvature control wedge 111 according to the present invention to steer and thereby control the imprint-curvature of the resilient stamp 104.

FIG. 5 shows a preferred setup whereby the imprint-curvature is controlled by an curvature control wedge 111. This curvature control wedge 111 is placed at the inside of the curved, i.e., bent resilient stamp 104, pressing the flexible stamp in the desired curvature. This curvature control wedge 111 can be moved to the inside or outside, as indicated by the double arrow in FIG. 5, wherein the arrow in the direction of the resilient stamp 104 indicates outside movement and the arrow in the direction away from the resilient stamp 104 indicates inside movement. If moving to the outside the curvature of the resilient stamp 104 in contact with the discrete substrate 102 will be lowered, resulting in a smaller curvature radius r and a higher imprint pressure. This curvature control wedge 111 can be, amongst others, a bar or roller stepper in combination with a stepper motor. In contrast to standard roll-to-plate processes, the wedge 111 is not in contact with the discrete substrate 102 with stamp and lacquer in between.

In the case of an imprint process were the back clamp 106B is moving and the position of the substrate 102 and front clamp 106A are fixed, the curvature control wedge 111 has to move along with the back clamp 106B and the resilient stamp 104 movement aside, during the replication process to ensure a constant imprint pressure. In a different embodiment the position of the curvature control wedge 111 is fixed and the support platform 101 with discrete substrate 102 and the front clamp 106A move at the same speed and in opposite direction as the movement of the back clamp 106B. To ensure same speed either a belt can be used or a master-slave steering of two motors.

Figure 6:
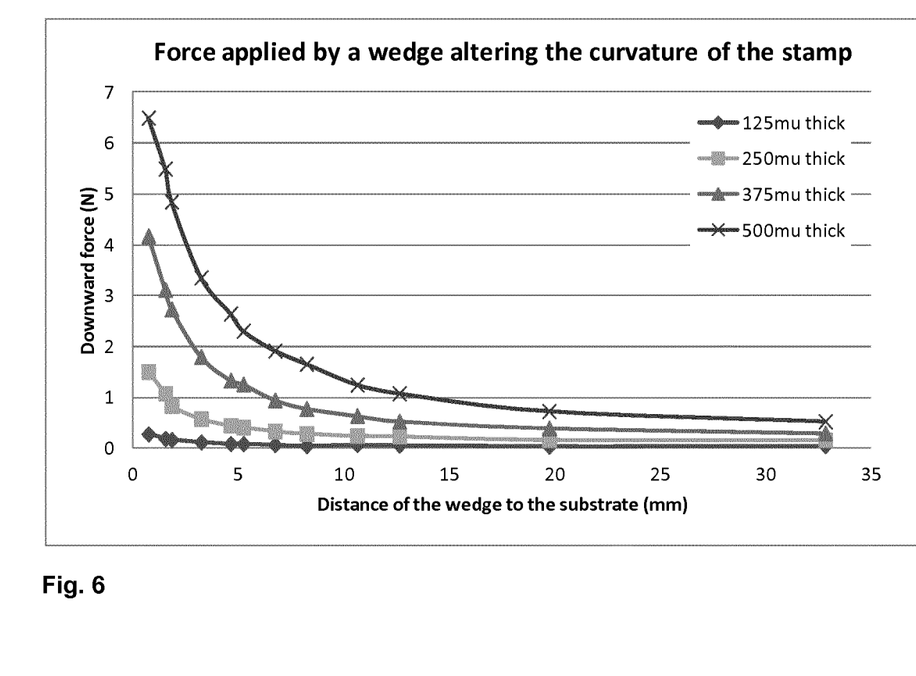
FIG. 6 depicts applied and measured resilience forces on a curved, i.e., bent resilient stamp 104 during imprinting according to the present invention as a function of the distance of the imprint-curvature control wedge 111 to the discrete substrate 102.

With the setup as discussed and shown in FIG. 1, and 3 to 5 discrete substrates 102 can be uniformly imprinted at low imprint pressure. The imprint pressure is measured at a weighing device. FIG. 6 shows the measurement results of the downward force, i.e., of the resilience force for different resilient stamp 104 thicknesses. In the measurement the wedge 111 is in steps placed outwards from a low distance to the substrate 102 and high imprint-curvature of the resilient stamp, to a high distance of the substrate 102 and low imprint-curvature of the resilient stamp 104. The further the wedge 111 is spaced apart from the substrate 102, with less pressure on the resilient stamp 104 and thereby a lower imprint-curvature, the less imprint pressure is applied on the imprint process. Low imprint pressures of well below 1 N over an area of 10 cm by 4 cm have been applied. This is a pressure of 0.025 N/cm$^2$.

The applied resilience force will depend on the stiffness of the resilient stamp 104. With a different material (elasticity) or thickness the stiffness of the resilient stamp 104 will change and thereby the applied resilience force will alter. As shown in FIG. 6 a thicker, less resilient stamp 104 will apply higher resilience forces. Thereby the imprint pressure range within the process according to the present invention can be tuned by selecting the elasticity of the resilient stamp material and its thickness.

The invention claimed is:

1. Process for texturing a discrete substrate with an imprint texture, wherein the process comprises the steps of:
   a) providing a resilient stamp comprising a patterned outer surface comprising openings and elevations,
   b) providing a discrete substrate,
   c) coating the resilient stamp and/or the discrete substrate with a formable imprint lacquer,
   d) bending the resilient stamp around one imaginary bending axis formed by an imaginary cylinder, the imaginary bending axis being parallel to a plane of the discrete substrate and perpendicular to an imprint direction to obtain a bent resilient stamp having a first leg and a second leg, whereby the bending is performed so that the second leg is bent towards the first leg,
   e) contacting the bent resilient stamp with formable imprint lacquer between the bent resilient stamp and discrete substrate so that the bent resilient stamp applies an imprint pressure onto the discrete substrate onto a contact area, wherein the imprint pressure is substantially generated by a resilience force of the bent resilient stamp, wherein the bent resilient stamp exhibits an imprint-curvature, wherein the imprint-curvature is defined by a radius of an imaginary cylinder which is drawn around the bent resilient stamp bent around the imaginary bending axis, f) moving the discrete substrate and/or the resilient stamp relative to one another and during said moving pressing the openings and elevations of the patterned outer surface with the imprint pressure into the formable imprint lacquer to provide the formable imprint lacquer with the imprint texture, and during said moving keeping the imprint-curvature of the bent resilient stamp constant, g) solidifying the formable imprint lacquer provided with the imprint texture on the substrate, and h) separating the resilient stamp from the textured discrete substrate.

2. Process according to claim 1, wherein the radius of the imaginary cylinder exhibits a value r, and r varies within a range of ±50% of r before starting the imprint process.

3. Process according to claim 1, wherein the resilient stamp provided in step a) exhibits a Young's Modulus in the range from 0.1 GPa to 210 GPa.

4. Process according to claim 1, wherein the resilient stamp provided in step a) has a thickness in the range from 10 μm to 2000 μm.

5. Process according to claim 1, wherein the resilient stamp provided in step a) comprises a resilient stamp base which is bonded to the patterned outer surface comprising openings and elevations.

6. Process according to claim 5, wherein a material for the resilient stamp base and/or for the patterned outer surface comprising openings and elevations is selected from a group comprising metal sheets, plastic sheets, rubber sheets, or glass sheets.

7. Process according to claim 1, wherein a material for the discrete substrate provided in step b) comprises glass, metal sheets, polycarbonate, polyester, or polymethylmethacrylate.

8. Process according to claim 1, wherein a method for the coating in step c) is dispensing, ink-jet-printing, slot-die coating, gravure printing, screen-printing, jetting, flexo-printing, or roller coating.

9. Process according to claim 1, wherein the resilient stamp is mounted in a front clamp positioned at an onset of the resilient stamp and in a back clamp positioned at an end of the resilient stamp, and wherein during the moving in step f) a glider supports a uniform movement of the back clamp and/or the front clamp.

10. Process according to claim 1, wherein a flexible stamp height blocker is located above the resilient stamp in a non-bent region of the resilient stamp between the back clamp and a bent-region of the resilient stamp and further controls the imprint pressure by controlling the imprint-curvature of the bent resilient stamp.

11. Process according to claim 1, wherein an imprint-curvature control wedge is placed at the inside of the bent resilient stamp and presses the resilient stamp into a desired imprint-curvature.

12. Equipment for texturing a discrete substrate comprising i. a discrete substrate defining a substrate plane, ii. a resilient stamp comprising a patterned outer surface comprising openings and elevations, wherein:

a. the resilient stamp is mounted in a front clamp which is positioned at an onset of the resilient stamp and in a back clamp which is positioned at an end of the resilient stamp, b. the resilient stamp comprises a second leg which is followed by a bent area which is followed by a first leg which is in contact with the substrate plane with formable imprint lacquer between the resilient stamp and the discrete substrate, c. the resilient stamp is bent in the bent area around one imaginary bending axis formed by an imaginary cylinder having an axis parallel to a plane of the discrete substrate and perpendicular to an imprint direction to obtain a bent resilient stamp, so that the bent resilient stamp applies an imprint pressure onto the discrete substrate onto a contact area, wherein the imprint pressure is substantially generated by a resilience force of the bent resilient stamp, wherein the bent resilient stamp exhibits one imprint-curvature, wherein the imprint-curvature is defined by a radius of an imaginary cylinder which is drawn around the bent resilient stamp bent around the imaginary bending axis, iii. a belt, a motor or a screw coupled with the back clamp and moving the bent resilient stamp in contact with the discrete substrate with formable imprint lacquer between the resilient stamp and the discrete substrate, wherein the discrete substrate is in a fixed position, and/or a belt or master-slave steering two motors coupled with the support platform and/or the front clamp and moving the support platform with the bent resilient stamp thereon and/or the front clamp with resilient stamp clamped therein at a same speed but in opposite direction as movement of the back clamp, iv. a controller to control the imprint-curvature of the bent resilient stamp, whereby the imprint curvature is adjusted and/or kept constant, and v. a device for solidification of the formable imprint lacquer provided with an imprint texture.

13. Equipment according to claim 12 furthermore comprising at least one glider to support uniform movement of the resilient stamp.

14. Equipment according to claim 12 furthermore comprising a stamp height blocker to control the imprint-curvature of the bent resilient stamp.

15. Equipment according to claim 12, further comprising an imprint-curvature control wedge to control an imprint-curvature of the bent resilient stamp.

* * * * *